(12) United States Patent
Horak et al.

(10) Patent No.: US 6,749,969 B2
(45) Date of Patent: Jun. 15, 2004

(54) REVERSE TONE PROCESS FOR MASKS

(75) Inventors: David V. Horak, Essex Junction, VT (US); Robert K. Leidy, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 172 days.

(21) Appl. No.: 09/992,767

(22) Filed: Nov. 14, 2001

(65) Prior Publication Data

US 2003/0091907 A1 May 15, 2003

(51) Int. Cl.⁷ .................................................. G03F 9/00
(52) U.S. Cl. .......................... 430/5; 430/313; 430/314; 430/315
(58) Field of Search ........................... 430/5, 313, 314, 430/315

(56) References Cited

U.S. PATENT DOCUMENTS

| | | | |
|---|---|---|---|
| 4,174,219 A | 11/1979 | Anares et al. | 430/321 |
| 4,306,006 A | 12/1981 | Descamps et al. | 430/5 |
| 5,229,230 A | 7/1993 | Kamon | 430/5 |
| 5,397,663 A | 3/1995 | Uesawa et al. | 430/5 |
| 5,578,422 A | 11/1996 | Mizuno et al. | 430/313 |
| 5,792,596 A | 8/1998 | Yasuzato et al. | 430/327 |
| 5,932,395 A | 8/1999 | Okamoto et al. | 430/311 |
| 5,976,968 A | 11/1999 | Dai | 438/622 |
| 6,020,109 A | 2/2000 | Okamoto et al. | 430/311 |
| 6,022,644 A | 2/2000 | Lin et al. | 430/5 |
| 6,048,647 A | 4/2000 | Miyazaki et al. | 430/5 |
| 6,074,787 A | 6/2000 | Takeuchi | 430/5 |

*Primary Examiner*—Christopher G. Young
(74) *Attorney, Agent, or Firm*—Wood, Phillips, Katz, Clark & Mortimer

(57) ABSTRACT

A reverse image mask is produced by initially depositing a metallic layer on a substrate. Resist is applied to the metallic layer to pattern desired features. The metallic layer is plated with a metal film, and the resist is then stripped. The metallic layer is etched using the metal film as a mask. Finally, the metal film is etched leaving the metallic layer etched in patterned areas to provide the reverse image mask.

29 Claims, 3 Drawing Sheets

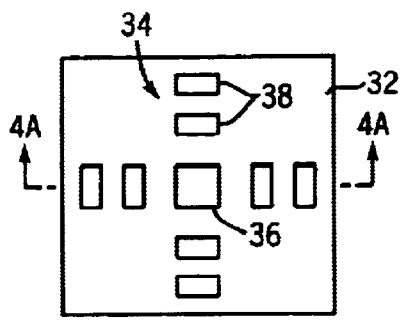 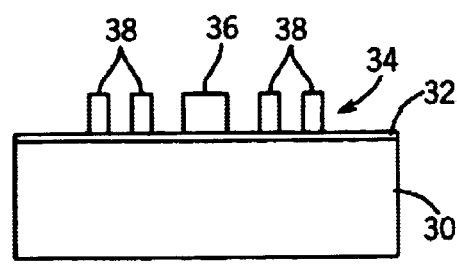
FIG. 4　　　　　　　　FIG. 4A
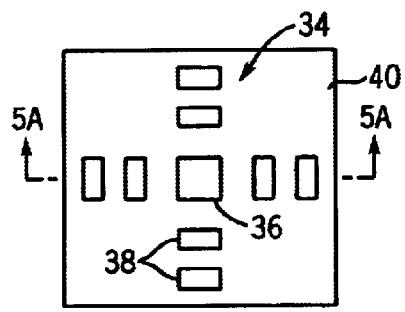 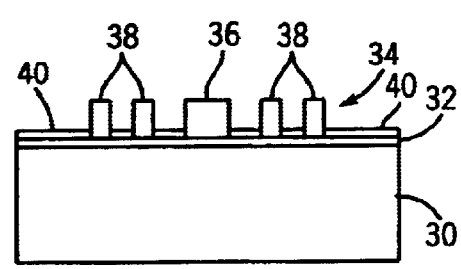
FIG. 5　　　　　　　　FIG. 5A
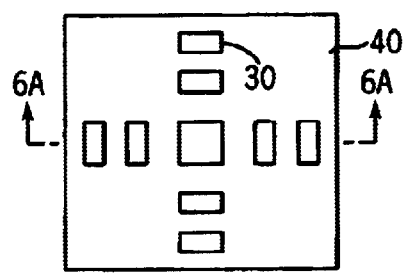 
FIG. 6　　　　　　　　FIG. 6A
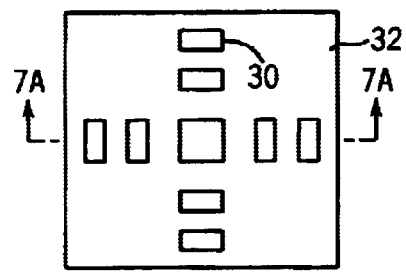 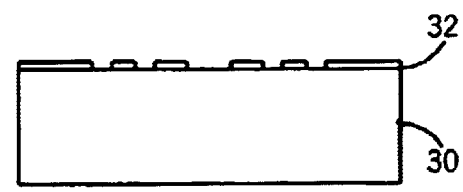
FIG. 7　　　　　　　　FIG. 7A

REVERSE TONE PROCESS FOR MASKS

BACKGROUND OF THE INVENTION

The present invention relates to a method of manufacturing masks composed of reticle patterns on chrome-coated plates or other types of correct negative masks and, more particularly, for producing a correct negative mask for damascene level production.

Masks are becoming a predominant factor in the manufacturer of integrated circuit semiconductor devices. Reduction lenses are used to reduce the patterning for applying to a wafer surface. To shrink patterns with each generation of semiconductor device, the amount of information on the mask increases considerably over time.

As a result, lithography is moving into new and difficult areas where the shrinking dimensions are no longer able to be resolved with standard techniques. Dense line and space patterns can be printed using off-axis light, such as annular, quadrapole or even dipole illumination. However, there are other features such as isolated and semi-dense structures to print which are not dense line and space patterns. It has been shown that these structures can be made to look dense by adding "assist" features to them. These sub-minimum assist features act to make the structure print as if it were a dense pattern, but are designed just below the resolution limits so they do not themselves print.

FIG. 1 illustrates the printing of standard desired features compared to printing of desired features and added assist features. Particularly, reference numeral 10 identifies a standard isolation line, while reference numeral 12 illustrates the isolated line along with the assist features on either side. In production, these assist features are printed on the reticle but do not print on the wafer. Similarly, reference numeral 14 identifies a series of nested lines as a desired feature, while corresponding reference numeral 16 illustrates the nested lines with assists. Finally, reference numeral 18 illustrates contacted pitch lines as a desired feature, while reference numeral 20 illustrates the contacted pitch lines with the assists. By making the structures look dense and using off-axis illumination, the process window (mostly depth of focus) for printing all of the features improves significantly.

The addition of assist features to the standard design features has become an industry standard solution for producing correct positive reticles with positive tone resists. However, reticles used in creating damascene level are not correct positive masks. Instead, correct negative masks are used in manufacturing for the contact/vias and metal lines.

When the pattern illustrated in FIG. 1 is reversed, small holes must be resolved instead of small lines. The resolution and linearity for printing small lines is significantly better than small holes, as illustrated by the curves in FIG. 2. The curves labeled with the suffix "Opq", representing opaque, refer to isolated lines printed with correct positive designs. Conversely, the curves labeled with the suffix "Clr", representing clears, refers to printing of isolated holes or spaces. The prefix "3500" identifies a tool that is an I-line mask writer ideal for printing these features as it can print with a very small grid. The curves with the suffix "Meb" represents an MEBES e-beam tool. Both tools show significantly better performance for the printing of small lines than for the printing of small holes.

The present invention is directed to further improvements in mask manufacture.

SUMMARY OF THE INVENTION

In accordance with the invention, there is provided a method for producing a correct negative reticle with positive tone resists. This method is not necessarily limited to binary masks but could be used with other masks that could utilize a reverse tone process.

Broadly, in accordance with one aspect of the invention there is provided a method of producing a reverse image mask comprising the steps of: depositing a metallic layer on a substrate; applying resist on the metallic layer to pattern desired features; plating the metallic layer with a metal film; stripping the resist; and etching the metallic layer using the metal film as a mask.

It is a feature of the invention that depositing a metallic layer on the substrate comprises depositing chrome on the substrate.

In accordance with one aspect of the invention, the substrate comprises a glass substrate.

In accordance with another aspect of the invention, the substrate comprises a quartz substrate.

The metal film may comprise copper or nickel, or the like.

It is a feature of the invention that applying resist on the metallic layer to pattern desired features comprises printing a reverse pattern in positive tone resist.

It is a further feature of the invention to include the step of etching the metal film to provide the reverse image mask.

It is yet another feature of the invention that plating the metallic layer with a metal film comprises electroplating copper to the metallic layer in areas not covered by the resist pattern.

It is still another feature of the invention that applying resist on the metallic layer further comprises applying assist features proximate the desired features.

There is disclosed in accordance with another aspect of the invention a method of producing a correct negative reticle with positive tone resist comprising the steps of depositing an opaque metallic layer on a transparent substrate; printing a reverse pattern of positive tone resist on the opaque metallic layer to pattern desired features; plating the opaque metallic layer with copper in non-patterned areas; stripping the resist; and etching the opaque metallic layer using the copper in the non-patterned areas as a mask.

Further features and advantages of the invention will be apparent from the specification and from the drawings.

BRIEF DESCRIPTION OF THE DRAWING

FIGS. 4–7 are plan views illustrating a method of producing a reverse image mask in accordance with the invention; and FIGS. 4A–7A comprise sectional views of respective FIGS. 4–7.

DETAILED DESCRIPTION OF THE DRAWINGS

Figure 1:
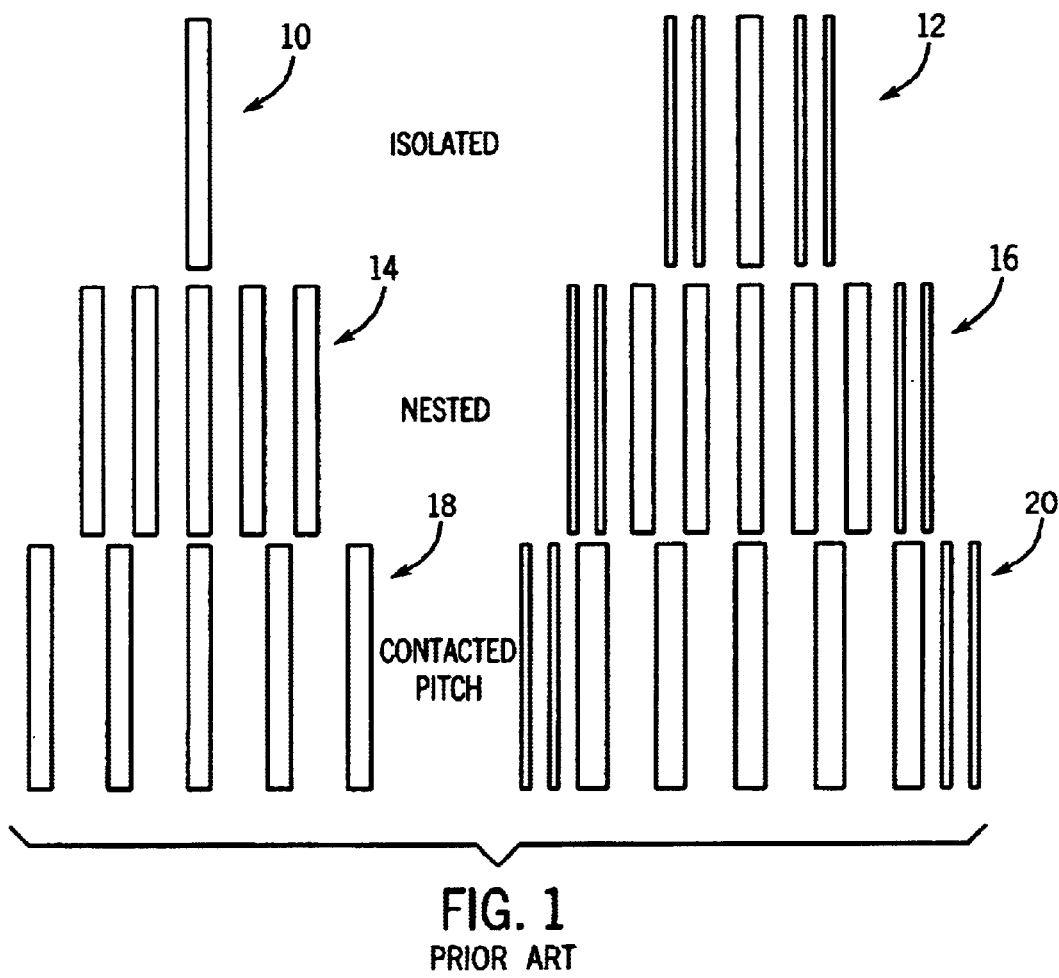
FIG. 1 is a plan view of prior art mask patterns formed with and without assist features.
Figure 3:
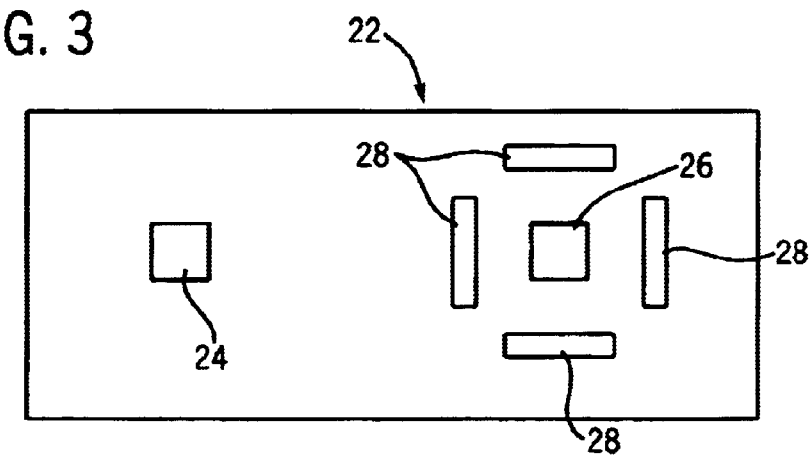
FIG. 3 is a plan view of a mask pattern illustrating small assist features for small holes used for damascene levels.
Figure 2:
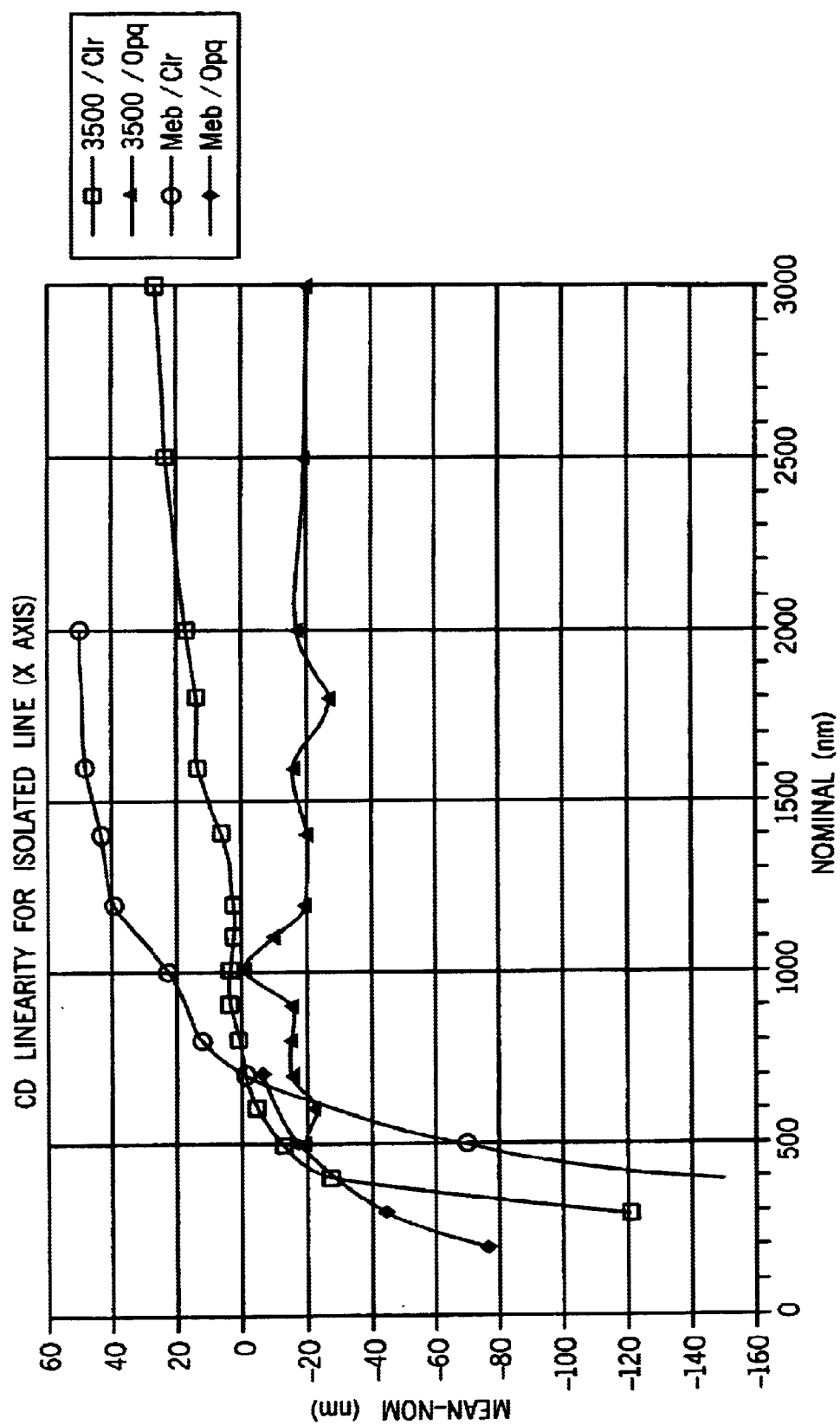
FIG. 2 is a series of curves illustrating resolution and linearity for printing small lines compared to small holes on a mask.

Referring initially to FIG. 3, a plan view of a portion of a reverse image mask in the form of a correct negative reticle 22 is illustrated. Particularly, to produce the mask 22, the tone is reversed compared to that in FIG. 1, for damascene levels. The reticle 22 includes an isolated hole 24 as a desired feature in a left-most portion, and an isolated hole 26 surrounded by small assist features 28 in a right-most portion. The small assist features 28 are beyond the resolution limit for prior art processes and would not print on the mask. The present invention relates to a method to make a similar pattern on a mask by printing this image as a correct positive pattern with a simple image reversal process during mask making. The method is illustrated in FIGS. 4–7 and FIGS. 4A–7A.

Referring initially to FIGS. 4 and 4A, a transparent substrate 30, which may be quartz or glass or the like, has a metallic layer 32 thereon. The metallic layer 32 may be opaque. In the illustrated embodiment of the invention, the opaque metallic layer 32 comprises a chrome layer. Other metals, such as iron oxide, gold or aluminum oxide could be used instead of chrome, as is apparent. A reverse pattern 34 is printed in standard positive tone resist on the chrome layer 32. The reverse pattern 34 includes a desired feature 36, and assist features 38. Particularly, this pattern is formed by creating a correct negative mask. The polarity of the mask is flipped to print in the opposite positive tone to print "islands" representing the desired features and the assist features which will be small holes in the resulting mask. Photo resist is applied to the chrome layer 32 and is then addressed with a laser or e-beam at a pixel level to form the pattern 34.

Subsequently, a metal film 40 is electroplated on the opaque metallic layer 32, see FIGS. 5 and 5A. In the illustrated embodiment of the invention, the metal film comprises copper. Alternatively, the metal film 40 could comprise nickel or the like. During the electroplating process the metal film will not print in the photo resist pattern areas 34. Instead, it will only print in non-patterned areas having exposed chrome.

The next step in the process is to strip the photo resist in the pattern 34. A scanning electron microscope is then used to measure the copper layer 40 on the opaque metallic layer 32 after which a chrome dry etch is performed using the copper layer 40 as a mask to remove the opaque metallic layer 32 from the patterned areas previously having the positive tone resist, as shown in FIGS. 6 and 6A. As a result, the substrate 30 is visible in the patterned area previously having the positive tone resist. Finally, a wet copper etch is performed to remove the copper layer 40 to provide the reverse image mask shown in FIGS. 7 and 7A. Particularly, the method produces a correct negative reticle 42 having pattern holes consisting of design features and assist features as particularly illustrated in FIG. 7. The holes are located in the patterned areas previously having the positive tone resist.

Thus, the described method uses image reversal and application of a positive tone resist. The copper film is used as a sacrificial layer to produce the reverse image mask.

Even though the process illustrated is applied to a binary mask it is possible to apply the same methodology to other types of semiconductor masks which use reverse images. Examples include stencil masks or half-tone masks (attenuated phase shift masks). Also other plating processes such as electrolysis may be utilized as well as electroplating.

In that spirit the present invention is intended to cover various modifications and equivalent arrangements included within the spirit and scope of the appended claims.

We claim:

1. A method of producing a reverse image mask comprising the steps of:

depositing a metallic layer on a substrate;

applying resist on the metallic layer to pattern desired features;

plating the metallic layer with a metal film;

stripping the resist; and etching the metallic layer using the metal film as a mask.

2. The method of claim 1 wherein depositing the metallic layer on the substrate comprises depositing chrome on the substrate.

3. The method of claim 1 wherein the substrate has an attenuated layer deposited thereon.

4. The method of claim 1 wherein the substrate comprises a glass substrate.

5. The method of claim 1 wherein the substrate comprises a quartz substrate.

6. The method of claim 1 wherein the metal film comprises copper.

7. The method of claim 1 wherein the metal film comprises nickel.

8. The method of claim 1 wherein applying resist on the metallic layer to pattern design features comprises printing a reverse pattern in positive tone resist.

9. The method of claim 1 further comprising the step of etching the metal film to provide the reverse image mask.

10. The method of claim 1 wherein plating the metallic layer with a metal film comprises electroplating copper to the metallic layer in areas not covered by the resist pattern.

11. The method of claim 1 wherein applying resist on the metallic layer further comprises applying assist features proximate the desired features.

12. A method of producing a correct negative reticle with positive tone resist comprising the steps of:

depositing an opaque metallic layer on a transparent substrate;

printing a reverse pattern of positive tone resist on the opaque metallic layer to pattern desired features;

plating the opaque metallic layer with copper in non-patterned areas;

stripping the resist; and etching the opaque metallic layer using the copper in the non-patterned areas as a mask.

13. The method of claim 12 wherein depositing an opaque metallic layer on a transparent substrate comprises depositing chrome on the transparent substrate.

14. The method of claim 12 wherein the substrate comprises a glass substrate.

15. The method of claim 12 wherein the substrate comprises a quartz substrate.

16. The method of claim 12 further comprising the step of etching the copper to provide the correct negative reticle.

17. The method of claim 12 wherein plating the opaque metallic layer with copper comprises electroplating copper to the opaque metallic layer in the non-patterned areas.

18. The method of claim 12 wherein printing a reverse pattern of positive tone resist on the opaque metallic layer further comprises applying assist features proximate the desired features.

19. A method of producing a reverse image mask comprising the steps of:

depositing an opaque metallic layer on a substrate;

applying resist on the opaque metallic layer to pattern desired features;

plating the opaque metallic layer with a metal film;

stripping the resist; and etching the opaque metallic layer using the metal film as a mask.

20. The method of claim 19 wherein depositing the opaque metallic layer on a substrate comprises depositing chrome on the substrate.

21. The method of claim 19 wherein the substrate has an attenuated layer deposited thereon.

22. The method of claim 19 wherein the substrate comprises a glass substrate.

23. The method of claim 19 wherein the substrate comprises a quartz substrate.

24. The method of claim 19 wherein the metal film comprises copper.

25. The method of claim 19 wherein the metal film comprises nickel.

26. The method of claim 19 wherein applying resist on the opaque metallic layer to pattern design features comprises printing a reverse pattern in positive tone resist.

27. The method of claim 19 further comprising the step of etching the metal film to provide the reverse image mask.

28. The method of claim 19 wherein plating the opaque metallic layer with a metal film comprises electroplating copper to the opaque metallic layer in areas not covered by the resist pattern.

29. The method of claim 19 wherein applying resist on the opaque metallic layer further comprises applying assist features proximate the desired features.

* * * * *